US012801797B2

(12) United States Patent
Antony

(10) Patent No.: US 12,801,797 B2
(45) Date of Patent: Nov. 17, 2026

(54) METHOD AND SYSTEM FOR GENERATING ENGINEERING DIAGRAMS IN AN ENGINEERING SYSTEM

(71) Applicant: Siemens Aktiengesellschaft, Munich (DE)

(72) Inventor: Elvis Antony, Bangalore (IN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 1115 days.

(21) Appl. No.: 17/783,812

(22) PCT Filed: Dec. 11, 2020

(86) PCT No.: PCT/EP2020/085776
§ 371 (c)(1),
(2) Date: Jun. 9, 2022

(87) PCT Pub. No.: WO2021/116414
PCT Pub. Date: Jun. 17, 2021

(65) Prior Publication Data

US 2023/0011461 A1 Jan. 12, 2023

(30) Foreign Application Priority Data

Dec. 13, 2019 (EP) .................................... 19216088

(51) Int. Cl.
*G06F 30/10* (2020.01)
*G06F 8/20* (2018.01)
(Continued)

(52) U.S. Cl.
CPC ................ *G06F 30/10* (2020.01); *G06F 8/22* (2013.01); *G06F 30/27* (2020.01); *G06F 8/20* (2013.01);
(Continued)

(58) Field of Classification Search
None
See application file for complete search history.

(56) References Cited

U.S. PATENT DOCUMENTS

| | | | | |
|---|---|---|---|---|
| 6,226,780 B1 * | 5/2001 | Bahra | G06F 30/30 716/102 |
| 7,089,530 B1 * | 8/2006 | Dardinski | G05B 15/02 717/109 |

(Continued)

FOREIGN PATENT DOCUMENTS

| | | |
|---|---|---|
| CN | 104679932 A | 6/2015 |
| EP | 3037901 A2 | 6/2016 |

(Continued)

OTHER PUBLICATIONS

PCT International Search Report and Written Opinion of International Searching Authority mailed Mar. 9, 2021 corresponding to PCT International Application No. PCT/EP2020/085776 filed Dec. 11, 2020.

*Primary Examiner* — Akash Saxena
(74) *Attorney, Agent, or Firm* — Schmeiser Olsen PLLC

(57) ABSTRACT

A method and system for generating engineering diagrams in an engineering system includes receiving specification of one or more physical components. Further, the method includes obtaining, from a data source, a first engineering diagram representing a portion of a technical installation. The method further includes identifying a deviation in the one or more physical components, physical connections and the parameter values in the first engineering diagram based on the specification of the one or more physical components. Furthermore, the method includes generating an engineering diagram analytics model for the first engineering diagram based on the identified deviation in the one or more physical components, the physical connections and the parameter values in the first engineering diagram. Also, the method (Continued)

includes generating a second engineering diagram representing the upgraded portion of the technical installation based on the generated engineering diagram analytics model.

14 Claims, 15 Drawing Sheets

(51) Int. Cl.
*G06F 8/33* (2018.01)
*G06F 8/35* (2018.01)
*G06F 30/20* (2020.01)
*G06F 30/27* (2020.01)

(52) U.S. Cl.
CPC .................. *G06F 8/33* (2013.01); *G06F 8/35* (2013.01); *G06F 30/20* (2020.01)

(56) References Cited

U.S. PATENT DOCUMENTS

| | | | | |
|---|---|---|---|---|
| 8,775,934 | B2 * | 7/2014 | Nasle | G06F 30/20 715/740 |
| 8,813,024 | B2 * | 8/2014 | Akkiraju | G06F 8/35 717/104 |
| 9,916,398 | B2 * | 3/2018 | Mazula | G06F 30/00 |
| 9,977,563 | B2 * | 5/2018 | Kodosky | G06F 8/33 |
| 10,049,479 | B2 * | 8/2018 | Mazula | G06T 11/60 |
| 11,651,271 | B1 * | 5/2023 | Xu | G06N 20/00 706/12 |
| 12,282,420 | B2 * | 4/2025 | Antony | G06N 5/022 |
| 2010/0077386 | A1 * | 3/2010 | Akkiraju | G06F 8/36 717/136 |
| 2010/0161287 | A1 * | 6/2010 | Sauerhoefer | G01B 21/04 702/155 |
| 2011/0055093 | A1 | 3/2011 | Kling et al. | |
| 2012/0116728 | A1 * | 5/2012 | Shear | G06F 30/00 703/1 |
| 2014/0019112 | A1 * | 1/2014 | Canedo | G06F 30/20 703/21 |
| 2016/0179993 | A1 * | 6/2016 | Maturana | G06F 30/20 703/7 |
| 2016/0182309 | A1 * | 6/2016 | Maturana | G06F 30/20 709/224 |
| 2016/0274558 | A1 | 9/2016 | Strohmenger et al. | |
| 2018/0322222 | A1 * | 11/2018 | Cochrane | G06F 30/00 |
| 2018/0341850 | A1 * | 11/2018 | Nakhjavani | G06F 30/23 |
| 2019/0138667 | A1 * | 5/2019 | Benesh | G06F 30/13 |
| 2021/0096543 | A1 * | 4/2021 | Stump | G06F 8/20 |
| 2021/0245005 | A1 * | 8/2021 | Pao | G06N 20/00 |
| 2022/0050946 | A1 * | 2/2022 | Lee | G06F 30/27 |
| 2022/0171891 | A1 * | 6/2022 | Sinha | G06F 30/27 |
| 2023/0168665 | A1 * | 6/2023 | Sajanikar | G06F 30/13 700/97 |
| 2026/0037694 | A1 * | 2/2026 | Cafaro | G06F 30/27 |

FOREIGN PATENT DOCUMENTS

| | | | | |
|---|---|---|---|---|
| EP | 3070547 A2 | 9/2016 | | |
| EP | 3121668 A1 * | 1/2017 | | G05B 19/042 |
| WO | 0173546 A2 | 10/2001 | | |

* cited by examiner

METHOD AND SYSTEM FOR GENERATING ENGINEERING DIAGRAMS IN AN ENGINEERING SYSTEM

CROSS-REFERENCE TO RELATED APPLICATIONS

This application claims priority to PCT Application No. PCT/EP2020/085776, having a filing date of Dec. 11, 2020, which claims priority to EP Application No. 19216088.5, having a filing date of Dec. 13, 2019, the entire contents both of which are hereby incorporated by reference.

FIELD OF TECHNOLOGY

The following relates to a field of engineering systems, and more particularly relates to a method and system for generating engineering diagrams in an engineering system.

BACKGROUND

In an automation environment, an engineering system provides a platform for generating representations of one or more physical components, physical connections between the one or more physical components in a technical installation and corresponding parameter values of the one or more physical components and the physical connections. The one or more physical components may include, for example, a programmable logic controller, one or more field devices, or any other automation devices. The representations may include graphical representations of the one or more physical components and the physical connections between the one or more physical components. These representations are generally provided as an 'engineering diagram'.

Typically, in order to generate such engineering diagrams in the engineering system, a code developer may have to write several graphical programs for each of the one or more physical components, the corresponding parameter values, and the physical connections and the corresponding parameter values. Specifically, the engineering systems provide users with a program editor in order to generate such graphical programs (by dragging and dropping desired graphical program blocks from an element library). Later, such graphical programs generated in the program editor are compiled and downloaded onto the one or more physical components such as a programmable logic controller (PLC) used for industrial control applications.

Conventional engineering systems employs functions and other resources to provide assistance to the code developers in designing and implementing engineering diagrams related to the technical installation. These conventional engineering systems, however, lack automated engineering methods that generate engineering diagrams on the engineering systems by assisting code developers to address and solve complex coding problems. For instance, when using an unfamiliar library in the engineering system in order to generate an engineering diagram, a code developer cannot receive automated guidance from a conventional engineering system for best coding practices to optimize use of such library and automatically generate desired engineering diagram. In particular, conventional engineering systems do not provide automated programming assistance by offering guidance or suggestions to enhance the quality of code that is written by the code developer thereby automating engineering involved in generating engineering diagrams.

Another instance is, when the code developer requires to reverse or rewrite an erroneous code in order to regenerate an engineering diagram, the conventional engineering systems allows the code developer to perform 'rewrite or redo' functions step by step which consumes huge amount of time. Also, if the software developer would like to reuse a particular set of code written in different programming language than the one being currently used, the conventional engineering system do not support the integration of such different programming languages while developing a particular code. This restricts the reusability of already developed code with a similar programming logic. Moreover, the conventional engineering systems does not support translation of a particular set of code from one programming language into a desired programming language automatically.

In light of above, there exists a need for an efficient method and system for generating engineering diagrams in engineering systems.

SUMMARY

Therefore, an aspect relates to provide a method and system for generating engineering diagrams in an engineering system.

An aspect relates to a method for generating engineering diagrams in an engineering system. The method comprises receiving specification of one or more physical components. The specification of the one or more physical components correspond to an upgraded portion of a technical installation. The one or more physical components related requirement comprises information related to the one or more physical components 108A-N, physical connections between the one or more physical components 108A-N, and a plurality of parameter values associated with the one or more physical components 108A-N and the physical connections. The one or more physical components comprises servers, robots, switches, automation devices, programmable logic controllers (PLC)s, human machine interfaces (HMIs), motors, valves, pumps, actuators, sensors and other industrial equipment(s) and the like. The technical installation may be an industrial plant.

Further, the method comprises obtaining a first engineering diagram representing a portion of the technical installation. The first engineering diagram comprises a representation of one or more physical components in the portion of the technical installation, physical connections between the one or more physical components, and a plurality of parameter values associated with the one or more physical components and the physical connections. The physical connections may be a physical link (such as wirings or cables). In an alternate embodiment, the connections may also be a virtual link. The plurality of parameter values comprises motor configuration parameters, network and communication parameter, valve controls, temperature or pressure values of a sensor, speed, torque and the like. The representation may be a graphical representation of the technical installation comprising graphical program blocks. The graphical program blocks correspond to one or more graphical programs. Further, the first engineering diagram comprising a representation of one or more physical components in the portion of the technical installation, physical connections between the one or more physical components, and a plurality of parameter values associated with the one or more physical components and the physical connections are configured in the engineering system using a respective graphical program and wherein each graphical program comprises a program logic associated with each of the one or more physical components, physical connections between the one or more physical components and the plurality of parameter values. Furthermore, the method comprises identifying a deviation in the one or more physical components, physical connections and the parameter values in the first engineering diagram based on the specification of the one or more physical components. The method further comprises generating an engineering diagram analytics model for the first engineering diagram based on the identified deviation in the one or more physical components, the physical connections and the parameter values in the first engineering diagram. Additionally, the method comprises generating a second engineering diagram representing the upgraded portion of the technical installation based on the generated engineering diagram analytics model. The upgraded portion of the technical installation comprises a change in the one or more physical components, the physical connections and the parameter values in the first engineering diagram. Moreover, the method comprises outputting the second engineering diagram representing the upgraded portion of the technical installation (106) on a graphical user interface.

In an embodiment, the method comprises generating a simulation instance for the second engineering diagram representing the upgraded portion of the technical installation. Further, the method comprises simulating behavior of the upgraded portion of the technical installation in a simulation environment by executing the second engineering diagram on the generated simulation instance. The method further comprises validating the behavior of the upgraded portion of the technical installation based on results of simulation.

In another embodiment, the method comprises deploying the second engineering diagram in real-time into the upgraded portion of the technical installation based on the validation results.

In identifying the deviation in the one or more physical components, the physical connections and the parameter values in the first engineering diagram based on the specification related to the one or more physical components, the method comprises parsing the specification of the one or more physical components indicating an upgraded portion of a technical installation. Further, the method comprises extracting the information related to the one or more physical components, physical connections between the one or more physical components, and a plurality of parameter values associated with the one or more physical components and the physical connections. Furthermore, the method comprises comparing the first engineering diagram representing the portion of a technical installation with the extracted information. Also, the method comprises identifying the deviation in the one or more physical components, physical connections and the parameter values in the first engineering diagram based on the comparison.

In generating the engineering diagram analytics model for the first engineering diagram based on the identified deviation in the one or more physical components, the physical connections and the parameter values in the first engineering diagram, the method comprises determining the parameter values associated with the received deviation in the one or more physical components and the physical connections. Further, the method comprises classifying the parameter values associated with the deviation in the one or more physical components and the physical connections into one or more engineering category. Each of the one or more engineering category comprises a set of defined actions to be performed. Also, the method comprises generating the engineering diagram analytics model for each of the classified engineering category. The engineering diagram analytics model defines a set of defined rules corresponding to each of the one or more engineering category.

In generating the second engineering diagram representing the upgraded portion of the technical installation based on the generated engineering diagram analytics model, the method comprises modifying the first engineering diagram based on the generated engineering diagram analytics model. Further, the method comprises generating the second engineering diagram representing the upgraded portion of the technical installation based on the modification.

In modifying the first engineering diagram based on the generated engineering diagram analytics model, the method comprises generating predictions for modifying the first engineering diagram based on the engineering diagram analytics model. The predictions comprise one or more changed parameter values associated with the one or more physical components and the physical connections. The method further comprises modifying the first engineering diagram based on the generated predictions.

In modifying the first engineering diagram based on the generated engineering diagram analytics model, the method comprises generating recommendations for modifying the first engineering diagram based on the engineering diagram analytics model. The recommendations indicate modifications to the first engineering diagram. The method further comprises modifying the first engineering diagram based on the generated recommendations.

In yet another embodiment, the method comprises identifying current programming language associated with the graphical programs of the first engineering diagram. Further, the method comprises determining a program logic pattern associated with the current programming language based on graphical program statements, graphical program data flow, basic graphical program data block demarcation and identifying number of jump values in the graphical program. Further, the method comprises generating a modified program logic pattern associated with a desired programming language based on the determined program logic pattern associated with the current programming language. Also, the method comprises transforming the current programming language associated with the graphical programs into a desired programming language based on the generated modified program logic pattern.

In still another embodiment, in modifying the first engineering diagram based on the generated engineering diagram analytics model, the method comprises classifying a first set of graphical programs of the first engineering diagram into one or more segments based on the program logic of the first set of graphical programs. The first set of graphical programs corresponds to a first programming language. The method further comprises determining a similar program logic associated with a second set of graphical programs stored in a database based on the classified one or more segments. The second set of graphical programs corresponds to a second programming language. Furthermore, the method comprises adapting the similar program logic of the second set of graphical programs into the program logic of the first set of graphical programs.

An aspect further relates to an engineering system for generating engineering diagrams. The engineering system comprises one or more processor(s) and a memory coupled to the processor. The memory comprises an automation module stored in the form of machine-readable instructions executable by the processor. The automation module is configured for performing the method as described above.

An aspect further relates to an industrial environment. The industrial environment comprising an engineering system, a technical installation comprising one or more physical components and one or more client devices communicatively coupled to the engineering system and the technical installation.

An aspect further relates to a computer-program product (non-transitory computer readable storage medium having instructions, which when executed by a processor, perform actions) having machine-readable instructions stored therein, that when executed by one or more processor(s), cause the one or more processor(s) to perform method steps as described above.

The above-mentioned and other features of the disclosure will now be addressed with reference to the accompanying drawings of the present disclosure. The illustrated embodiments are intended to illustrate, but not limit the disclosure.

BRIEF DESCRIPTION

Some of the embodiments will be described in detail, with reference to the following figures, wherein like designations denote like members, wherein.

DETAILED DESCRIPTION

Figure 1:
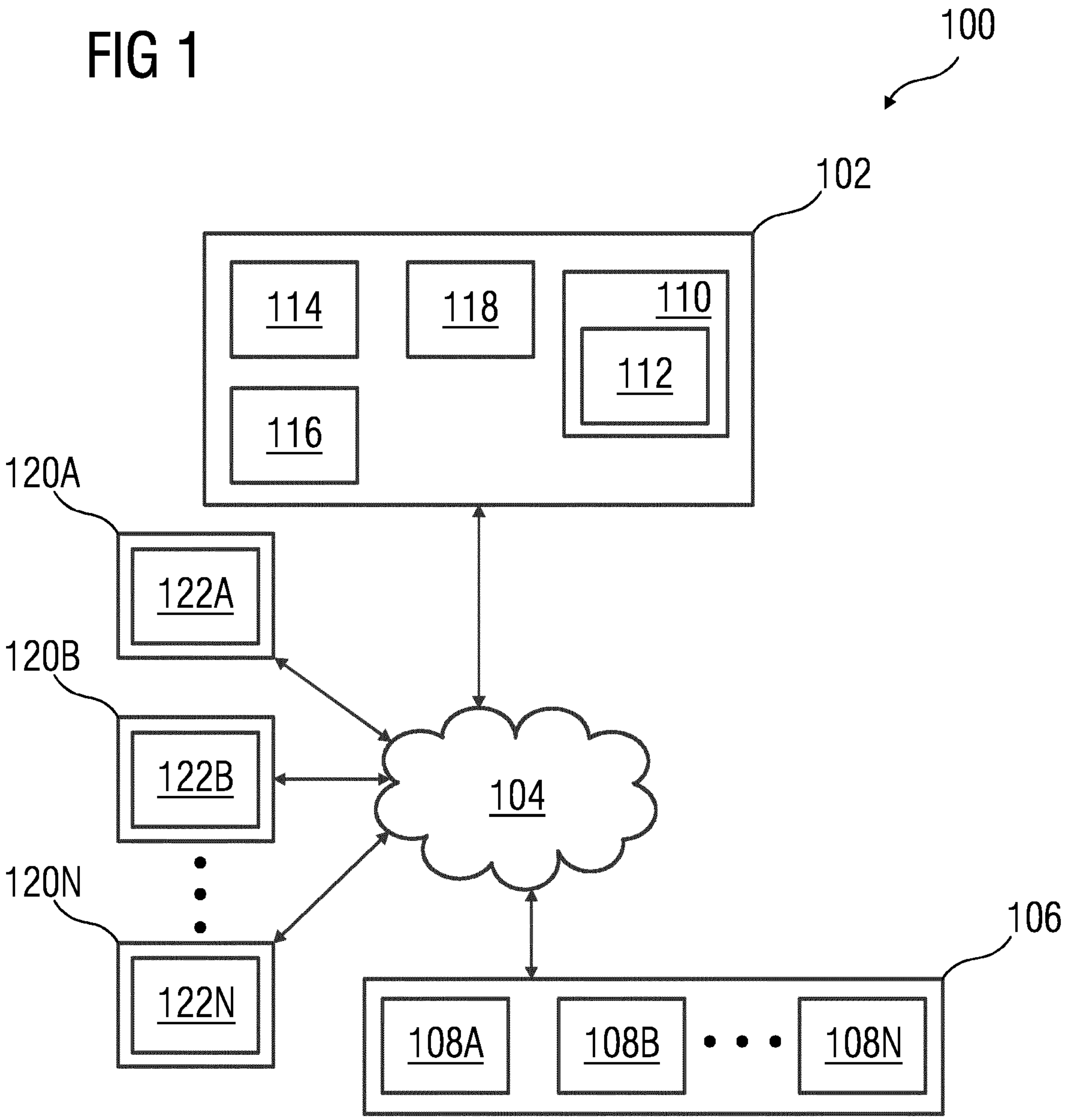
FIG. 1 is a block diagram of an industrial environment capable of generating engineering diagrams, according to an embodiment of the present disclosure.

Various embodiments are described with reference to the drawings, wherein like reference numerals are used to refer the drawings, wherein like reference numerals are used to refer to like elements throughout. In the following description, for the purpose of explanation, numerous specific details are set forth in order to provide thorough understanding of one or more embodiments. It may be evident that such embodiments may be practiced without these specific details.

FIG. 1 is a block diagram of an industrial environment 100 capable of generating engineering diagrams, according to an embodiment of the present disclosure. In FIG. 1, the industrial environment 100 includes an engineering system 102, a technical installation 106 and one or more client devices 120A-N. As used herein, "industrial environment" refers to a processing environment comprising configurable computing physical and logical resources, for example, networks, servers, storage, applications, services, etc., and data distributed over a platform, such as cloud platform. The industrial environment 100 provides on-demand network access to a shared pool of the configurable computing physical and logical resources. The engineering system 102 is communicatively connected to the technical installation 106 via the network 104 (such as Local Area Network (LAN), Wide Area Network (WAN), Wi-Fi, Internet, any short range or wide range communication). The engineering system 102 is also connected to the one or more client devices 120A-N via the network 104.

The engineering system 102 is connected to the one or more physical component(s) 108A-N in the technical installation 106 via the network 104. The one or more physical component(s) 108A-N may include servers, robots, switches, automation devices, programmable logic controllers (PLC)s, human machine interfaces (HMIs), motors, valves, pumps, actuators, sensors and other industrial equipment(s). The one or more physical component(s) 108A-N may be connected to each other or several other components (not shown in FIG. 1) via physical connections. The physical connections may be through wiring between the one or more physical component(s) 108A-N. Alternatively, the one or more physical component(s) 108A-N may also be connected via non-physical connections (such as Internet of Things (IOT)). Although, FIG. 1 illustrates the engineering system 102 connected to one technical installation 106, one skilled in the art can envision that the engineering system 102 can be connected to several technical installations 106 located at different locations via the network 104.

The client devices 120A-N may be a desktop computer, laptop computer, tablet, smart phone and the like. Each of the client devices 120A-N is provided with an engineering tool 122A-N for generating and/or editing engineering diagrams respectively. The client devices 120A-N may enable users to download the engineering system version of the engineering diagram and create a client version of the engineering diagram. The client devices 120A-N can access the engineering system 102 for automatically generating engineering diagrams. In an embodiment, the client devices 120A-N comprises an engineering system capable of running an industrial automation application. The client devices 120A-N can be a laptop computer, desktop computer, tablet computer, smartphone and the like. The client devices 120A-N can access cloud applications (such as providing performance visualization of the one or more physical component(s) 108A-N via a web browser. Throughout the specification, the terms "client device" and "user device" are used interchangeably.

The engineering system 102 may be a standalone server deployed at a control station or may be a remote server on a cloud. In an embodiment, the engineering system 102 may be a cloud engineering system. The engineering system 102 is capable of delivering applications (such as cloud applications) for managing a technical installation 106 comprising one or more physical component(s) 108A-N. The engineering system 102 may comprise a platform 110 (such as a cloud platform), an automation module 112, a server 114 including hardware resources and an operating system (OS), a network interface 116 and a database 118. The network interface 116 enables communication between the engineering system 102, the technical installation 106, and the client devise(s) 120A-N. The interface (such as cloud interface) (not shown in FIG. 1) may allow the engineers at the one or more client device(s) 120A-N to access engineering project files stored at the engineering system 102 and perform one or more actions on the engineering project files as same instance. The server 114 may include one or more servers on which the OS is installed. The servers 114 may comprise one or more processors, one or more storage devices, such as, memory units, for storing data and machine-readable instructions for example, applications and application programming interfaces (APIs), and other peripherals required for providing computing (such as cloud computing) functionality. The platform 110 enables functionalities such as data reception, data processing, data rendering, data communication, etc. using the hardware resources and the OS of the servers 114 and delivers the aforementioned services using the application programming interfaces deployed therein. The platform 110 may comprise a combination of dedicated hardware and software built on top of the hardware and the OS. In an exemplary embodiment, the platform 110 may correspond to an Integrated Development Environment (IDE) comprising program editors and compilers which allow the users of the client devices 120A-N to generate engineering diagrams. The platform 110 may further comprise an automation module 112 configured for generating engineering diagrams. Details of the automation module 112 is explained in FIG. 3 and FIG. 4.

The database 118 stores the information relating to the technical installation 106 and the client device(s) 120A-N. The database 118 is, for example, a structured query language (SQL) data store or a not only SQL (NoSQL) data store. In an exemplary embodiment, the database 118 may be configured as cloud-based database implemented in the industrial environment 100, where computing resources are delivered as a service over the platform 110. The database 118, according to another embodiment of the present disclosure, is a location on a file system directly accessible by the automation module 112. The database 118 is configured to store engineering project files, engineering diagrams, engineering diagram analytics model, parameter values associated with the engineering diagrams, test results, simulation results, status messages, behavior models associated with the one or more physical component(s) 108A-N, one or more simulation instances, graphical programs, program logics, program logic patterns, predictions and recommendations, one or more segments of the graphical program block, one or more engineering category, requirements, program update messages and the like.

Figure 2:
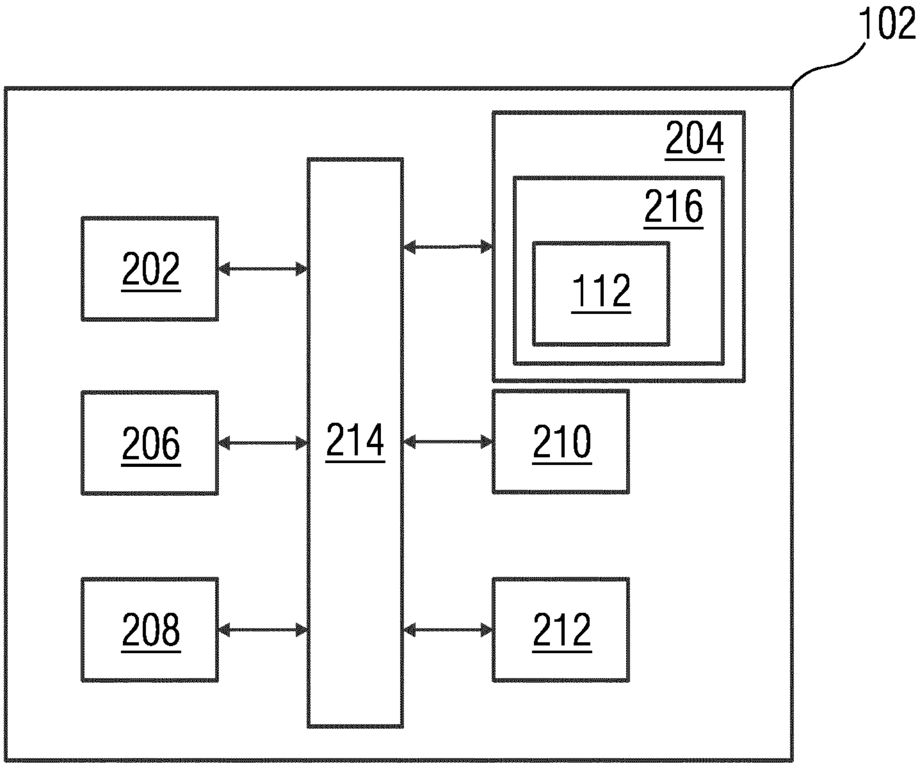
FIG. 2 is a block diagram of an engineering system, such as those shown in FIG. 1, in which an embodiment of the present disclosure can be implemented.

FIG. 2 is a block diagram of an engineering system 102, such as those shown in FIG. 1, in which an embodiment of the present disclosure can be implemented. In FIG. 2, the engineering system 102 includes a processor(s) 202, an accessible memory 204, a storage unit 206, a communication interface 208, an input-output unit 210, a network interface 212 and a bus 214.

The processor(s) 202, as used herein, means any type of computational circuit, such as, but not limited to, a microprocessor unit, microcontroller, complex instruction set computing microprocessor unit, reduced instruction set computing microprocessor unit, very long instruction word microprocessor unit, explicitly parallel instruction computing microprocessor unit, graphics processing unit, digital signal processing unit, or any other type of processing circuit. The processor(s) 202 may also include embedded controllers, such as generic or programmable logic devices or arrays, application specific integrated circuits, single-chip computers, and the like.

The memory 204 may be non-transitory volatile memory and non-volatile memory. The memory 204 may be coupled for communication with the processor(s) 202, such as being a computer-readable storage medium. The processor(s) 202 may execute machine-readable instructions and/or source code stored in the memory 204. A variety of machine-readable instructions may be stored in and accessed from the memory 204. The memory 204 may include any suitable elements for storing data and machine-readable instructions, such as read only memory, random access memory, erasable programmable read only memory, electrically erasable programmable read only memory, a hard drive, a removable media drive for handling compact disks, digital video disks, diskettes, magnetic tape cartridges, memory cards, and the like. In the present embodiment, the memory 204 includes an integrated development environment (IDE) 216. The IDE 216 includes an automation module 112 stored in the form of machine-readable instructions on any of the above-mentioned storage media and may be in communication with and executed by the processor(s) 202.

When executed by the processor(s) 202, the automation module 112 causes the processor(s) 202 to generate engineering diagrams in the engineering system 102. In an embodiment, the automation module 112 causes the processor(s) 202 to receive specification of one or more physical components 108A-N. The specification of the one or more physical component(s) 108A-N correspond to an upgraded portion of a technical installation 106. Upon receiving the specification of the one or more physical components 108A-N, the automation module 112 causes the processor(s) 202 to obtain a first engineering diagram representing a portion of the technical installation 106. The first engineering diagram comprises a representation of one or more physical components 108A-N in the portion of the technical installation 106, physical connections between the one or more physical components 108A-N, and a plurality of parameter values associated with the one or more physical components 108A-N and the physical connections. Specifically, the representation of one or more physical components 108A-N in the portion of the technical installation 106, the physical connections between the one or more physical components 108A-N, and the plurality of parameter values associated with the one or more physical components 108A-N and the physical connections which are comprised in the first engineering diagram are configured in the engineering system 102 using a respective graphical program. Each graphical program comprises a program logic associated with each of the one or more physical components 108A-N, the physical connections between the one or more physical components 108A-N and the plurality of parameter values. A user of the client device(s) 120A-N modifies the graphical program corresponding to components in the first engineering diagram using the engineering tool 122A-N.

Further, the automation module 112 causes the processor(s) 202 to identify a deviation in the one or more physical components 108A-N, physical connections and the parameter values in the first engineering diagram based on the specification of the one or more physical components 108A-N. Further, the automation module 112 causes the processor 202 to generate an engineering diagram analytics model for the first engineering diagram based on the identified deviation in the one or more physical components 108A-N, the physical connections and the parameter values in the first engineering diagram. Furthermore, the automation module 112 causes the processor(s) 202 to generate a second engineering diagram representing the upgraded portion of the technical installation 106 based on the generated engineering diagram analytics model. The upgraded portion of the technical installation 106 comprises a change in the one or more physical components 108A-N, the physical connections and the parameter values in the first engineering diagram. The second engineering diagram is different from the first engineering diagram. Specifically, the second engineering diagram comprises a modified representation of the modified one or more physical components 108A-N in the upgraded portion of the technical installation 106, modified physical connections between the modified one or more physical components 108A-N, and a modified plurality of parameter values associated with the modified one or more physical components 108A-N and the modified physical connections. Additionally, the automation module 112 causes the processor(s) 202 to output the second engineering diagram representing the upgraded portion of the technical installation 106 on a graphical user interface.

Further, the automation module 112 causes the processor(s) 202 to generate a simulation instance for the second engineering diagram representing the upgraded portion of the technical installation 106. Further, the automation module 112 causes the processor(s) 202 to simulate behavior of the upgraded portion of the technical installation 106 in a simulation environment by executing the second engineering diagram on the generated simulation instance. Also, the automation module 112 causes the processor(s) 202 to validate the behavior of the upgraded portion of the technical installation 106 based on results of simulation. Furthermore, the automation module 112 causes the processor(s) 202 to deploy the second engineering diagram in real-time into the upgraded portion of the technical installation 106 based on the validation results.

In identifying the change in the one or more physical components 108A-N, physical connections and the parameter values in the first engineering diagram based on the specification of the one or more physical components 108A-N, the automation module 112 causes the processor(s) 202 to parse the specification of the one or more physical components 108A-N indicating an upgraded portion of a technical installation 106. Further, the automation module 112 causes the processor(s) 202 to extract the information related to the one or more physical components 108A-N, physical connections between the one or more physical components 108A-N, and a plurality of parameter values associated with the one or more physical components 108A-N and the physical connections. The information related to the one or more physical components 108A-N, physical connections between the one or more physical components 108A-N, and a plurality of parameter values associated with the one or more physical components 108A-N and the physical connections comprises component configuration information, network information, communication information, and the like.

Further, the automation module 112 causes the processor (s) 202 to compare the first engineering diagram representing the portion of the technical installation 106 with the extracted information. A standard comparison algorithm known in the art may be used for this purpose. Further, the automation module 112 causes the processor(s) 202 to identify the deviation in the one or more physical components 108A-N, the physical connections and the parameter values in the first engineering diagram based on the comparison.

Also, in generating the engineering diagram analytics model for the first engineering diagram based on the identified deviation in the one or more physical components 108A-N, the physical connections and the parameter values in the first engineering diagram, the automation module 112 causes the processor(s) 202 to determine the parameter values associated with the deviation in the one or more physical components 108A-N and the physical connections. Further, the automation module 112 causes the processor(s) 202 to classify the parameter values associated with the deviation in the one or more physical components 108A-N and the physical connections into one or more engineering category. Each of the one or more engineering category comprises a set of defined actions to be performed. For example, the one or more engineering category comprises function block level, component level, program statement level, program logic level, domain level, syntax level, semantics level, domain or factory automation object level, object cluster level and the like. The set of defined actions comprises moving a program statements across function blocks, translating program statements from one programming language to another, inheriting program statements from one function block to another, redo or undo a program statement based on user inputs, parse program statements, compile program statements, and the like.

Furthermore, the automation module 112 causes the processor(s) 202 to generate the engineering diagram analytics model for each of the classified engineering category. The engineering diagram analytics model defines a set of defined rules corresponding to each of the one or more engineering category. For example, the set of defined rules comprises various standards such as industrial automation standards, design standards, coding standards, object relationship regulations and the like. The engineering diagram analytics model is generated based on the learnings from previously generated engineering diagrams. The learnings are obtained using any machine learning or artificial intelligence analysis method. For example, given a graphical program, the program logic, tokens, keywords, syntax, semantics, data structures associated with the graphical program are learnt and stored in the database 118 in the form of a trained program table.

In generating the second engineering diagram representing the upgraded portion of the technical installation 106 based on the generated engineering diagram analytics model, the automation module 112 causes the processor(s) 202 to modify the first engineering diagram based on the generated engineering diagram analytics model. Further, the automation module 112 causes the processor(s) 202 to generate the second engineering diagram representing the upgraded portion of the technical installation 106 based on the modification. Specifically, in modifying the first engineering diagram based on the generated engineering diagram analytics model, the automation module 112 causes the processor(s) 202 to generate predictions for modifying the first engineering diagram based on the engineering diagram analytics model and to modify the first engineering diagram based on the generated predictions. The predictions comprise one or more changed parameter values associated with the one or more physical components 108A-N and the physical connections. Also, the predictions are generated as the first engineering diagram is being modified. For example, during development of a graphical program corresponding to either one or more physical components 108A-N, or parameter values or the physical connections, the predictions are generated as program statements aiding the users to generate second engineering diagram as per the requirement received.

Furthermore, in modifying the first engineering diagram based on the generated engineering diagram analytics model, the automation module 112 causes the processor(s) 202 to generate recommendations for modifying the first engineering diagram based on the engineering diagram analytics model and to modify the first engineering diagram based on the generated recommendations. The recommendations indicate modifications to the first engineering diagram. The recommendations are generated as the first engineering diagram is being modified. For example, during modification of the first engineering diagram, specifically during modification of corresponding graphical program of the first engineering diagram, the recommendations are generated as program logic statements aiding the users to optimize generation of the second engineering diagram as per the requirement received.

Further, the automation module 112 causes the processor(s) 202 to identify current programming language associated with the graphical programs of the first engineering diagram. Also, the automation module 112 causes the processor(s) 202 to determine a program logic pattern associated with the current programming language based on graphical program statements, graphical program data flow, basic graphical program data block demarcation and identifying number of jump values in the graphical program. The automation module 112 further causes the processor(s) 202 to generate a modified program logic pattern associated with a desired programming language based on the determined program logic pattern associated with the current programming language. Also, the automation module 112 causes the processor(s) 202 to transform the current programming language associated with the graphical programs into a desired programming language based on the generated modified program logic pattern.

In modifying the first engineering diagram based on the generated engineering diagram analytics model, the automation module 112 causes the processor(s) 202 to classify first set of graphical programs of the first engineering diagram into one or more segments based on the program logic of the first set of graphical programs. The first set of graphical programs corresponds to a first programming language. The one or more segments are programming instructions between two logical end points within a graphical program. The segments can be removed from a main program and then be created as a separate function and be called in the main program. The first programming language may be a Structured common language (SCL) or Ladder logic or the like.

Further, the automation module 112 causes the processor(s) 202 to determine a similar program logic associated with a second set of graphical programs stored in a database 118 based on the classified one or more segments. The second set of graphical programs corresponds to a second programming language. The second programming language may be a common logic segments in structured text (ST) and graphical programming languages (LAD, FBD) and the like. Further, the automation module 112 causes the processor(s) 202 to adapt the similar program logic of the second set of graphical programs into the program logic of the first set of graphical programs.

The storage unit 206 may be a non-transitory storage medium configured for storing a database (such as database 118) which comprises server version of the engineering diagrams.

The communication interface 208 is configured for establishing communication sessions between the one or more client devices 120A-N and the engineering system 102. The communication interface 208 allows the one or more engineering applications running on the client devices 120A-N to import/import engineering project files into the engineering system 102. In an embodiment, the communication interface 208 interacts with the interface at the one or more client devices 120A-N for allowing the engineers to access the engineering diagrams associated with an engineering project file and perform one or more actions on the engineering diagrams stored in the engineering system 102.

The input-output unit 210 may include input devices a keypad, touch-sensitive display, camera (such as a camera receiving gesture-based inputs), etc. capable of receiving one or more input signals, such as user commands to process engineering project file. Also, the input-output unit 210 may be a display unit for displaying a graphical user interface which visualizes the behavior model associated with the modified engineering diagrams and also displays the status information associated with each set of actions performed on the graphical user interface. The set of actions may include execution of predefined tests, download, compile and deploy of graphical programs. The bus 214 acts as interconnect between the processor 202, the memory 204, and the input-output unit 210.

The network interface 212 may be configured to handle network connectivity, bandwidth and network traffic between the engineering system 102, client devices 120A-N and the technical installation 106.

Those of ordinary skilled in the art will appreciate that the hardware depicted in FIG. 2 may vary for particular implementations. For example, other peripheral devices such as an optical disk drive and the like, Local Area Network (LAN), Wide Area Network (WAN), Wireless (e.g., Wi-Fi) adapter, graphics adapter, disk controller, input/output (I/O) adapter also may be used in addition or in place of the hardware depicted. The depicted example is provided for the purpose of explanation only and is not meant to imply architectural limitations with respect to the present disclosure.

Those skilled in the art will recognize that, for simplicity and clarity, the full structure and operation of all data processing systems suitable for use with the present disclosure is not being depicted or described herein. Instead, only so much of an engineering system 102 as is unique to the present disclosure or necessary for an understanding of the present disclosure is depicted and described. The remainder of the construction and operation of the engineering system 102 may conform to any of the various current implementation and practices known in the art.

Figure 3:
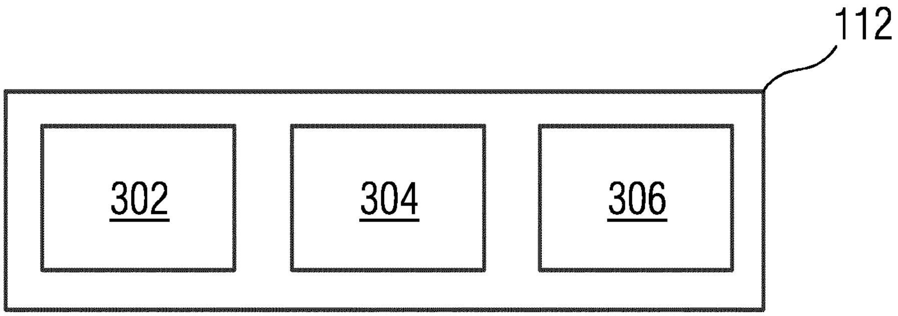
FIG. 3 is a block diagram of an automation module, such as those shown in FIG. 2, in which an embodiment of the present disclosure can be implemented.

FIG. 3 is a block diagram of an automation module 112, such as those shown in FIG. 2, in which an embodiment of the present disclosure can be implemented. In FIG. 3, the automation module 112 comprises an engineering module 302, a commissioning module 304 and a deployment module 306.

The engineering module 302 is configured for performing engineering (such as design, develop, configure) on the one or more physical components 108A-N of the technical installation 106. The engineering module 302 can develop graphical representations of the engineering diagrams. Specifically, the engineering module 302 is configured for receiving specification of the one or more physical components 108A-N. The specification of the one or more physical components 108A-N correspond to an upgraded portion of a technical installation 106. Further, the engineering module 302 is configured for obtaining, from a data base 118, a first engineering diagram representing a portion of the technical installation 106. The first engineering diagram comprises a representation of one or more physical components 108A-N in the portion of the technical installation 106, physical connections between the one or more physical components 108A-N, and a plurality of parameter values associated with the one or more physical components 108A-N and the physical connections. Also, the engineering module 302 is configured for analyzing the first engineering diagram based on the specification of the one or more physical components 108A-N and identifying a deviation in the one or more physical components 108A-N, physical connections and the parameter values in the first engineering diagram based on the specification of the one or more physical components 108A-N. Further, the engineering module 302 is configured for generating an engineering diagram analytics model for the first engineering diagram based on the identified deviation in the one or more physical components 108A-N, the physical connections and the parameter values in the first engineering diagram. Furthermore, the engineering module 302 is configured for generating a second engineering diagram representing the upgraded portion of the technical installation 106 based on the generated engineering diagram analytics model. The upgraded portion of the technical installation 106 comprises a change in the one or more physical components 108A-N, the physical connections and the parameter values in the first engineering diagram. The second engineering diagram is different from the first engineering diagram. Further, the engineering module 302 is configured for outputting the second engineering diagram representing the upgraded portion of the technical installation 106 on a graphical user interface. Further details of the engineering module 302 is explained in FIG. 4.

The commissioning module 304 is configured for generating a simulation instance for the second engineering diagram representing the upgraded portion of the technical installation 106. Further, the commissioning module 304 is configured for simulating behavior of the upgraded portion of the technical installation 106 in a simulation environment by executing the second engineering diagram on the generated simulation instance. The simulation environment emulates an actual technical installation, such as technical installation 106. Further, the simulation environment may be a virtual setup of the actual technical installation 106.

Further, the commissioning module 304 is configured for validating the behavior of the upgraded portion of the technical installation 106 based on results of simulation. The results of simulation may indicate success or failure of the generated second engineering diagram if deployed in the technical installation 106.

The deployment module 306 is configured for deploying the second engineering diagram in real-time into the upgraded portion of the technical installation 106 based on the validation results. If the validation results are positive, then the second engineering diagram is deployed in real time into the upgraded portion of the technical installation 106. If the validation results are negative, then the causes of the negative validation report are generated as a report and displayed to the user to re-design or re-modify the engineering diagram.

Figure 4:
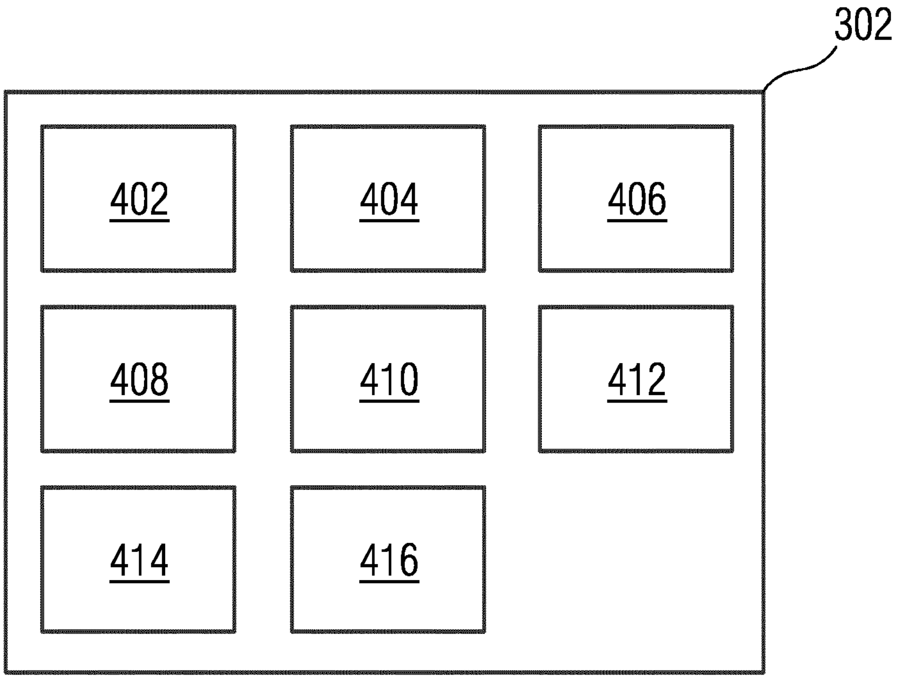
FIG. 4 is a block diagram of an engineering module, such as those shown in FIG. 3, in which an embodiment of the present disclosure can be implemented.

FIG. 4 is a block diagram of an engineering module 302, such as those shown in FIG. 3, in which an embodiment of the present disclosure can be implemented. In FIG. 4, the engineering module 302 comprises a requirement handler 402, an engineering diagram generation module 404, a modifier module 406, a program management module 408, engineering diagram analytics module 410, a programming language management module 412, a visualization module 414 and a data store 416.

The requirement handler 402 is configured for receiving specification of the one or more physical components 108A-N. The specification of the one or more physical components 108A-N correspond to an upgraded portion of a technical installation 106. The received specification comprises information related to the one or more physical components 108A-N, physical connections between the one or more physical components 108A-N, and a plurality of parameter values associated with the one or more physical components 108A-N and the physical connections. For example, the specification is received from one of the one or more users external to the industrial environment 100 via a network. In alternative embodiment, the specification is received from the one or the one or more client devices 120A-N via the network.

The engineering diagram generation module 404 is configured for obtaining, from a database 118, a first engineering diagram representing a portion of a technical installation 106. The first engineering diagram comprises a representation of one or more physical components 108A-N in the portion of the technical installation 106, physical connections between the one or more physical components 108A-N, and a plurality of parameter values associated with the one or more physical components 108A-N and the physical connections. In an embodiment, the representation of one or more physical components 108A-N in the portion of the technical installation 106, physical connections between the one or more physical components 108A-N, and a plurality of parameter values associated with the one or more physical components 108A-N and the physical connections, which are comprised in the first engineering diagram are configured in the engineering system 102 using a respective graphical program. Each graphical program comprises a program logic associated with each of the one or more physical components 108A-N, physical connections between the one or more physical components 108A-N and the plurality of parameter values.

Further, the engineering diagram generation module 404 is configured for analyzing the first engineering diagram based on the specification of the one or more physical components 108A-N. The engineering diagram generation module 404 is configured for identifying a deviation in the one or more physical components 108A-N, physical connections and the parameter values in the first engineering diagram based on the specification of the one or more physical components 108A-N. Specifically, in identifying the deviation in the one or more physical components 108A-N, physical connections and the parameter values in the first engineering diagram based on the specification of the one or more physical components 108A-N, the engineering diagram generation module 404 is configured for parsing the specification of the one or more physical components 108A-N indicating an upgraded portion of a technical installation 106. Further, the engineering diagram generation module 404 is configured for extracting the information related to the one or more physical components 108A-N, physical connections between the one or more physical components 108A-N, and a plurality of parameter values associated with the one or more physical components 108A-N and the physical connections. Further, the engineering diagram generation module 404 is configured for comparing the first engineering diagram representing the portion of a technical installation 106 with the extracted information. Also, the engineering diagram generation module 404 is configured for identifying the deviation in the one or more physical components 108A-N, physical connections and the parameter values in the first engineering diagram based on the comparison.

The identified deviation in the one or more physical components 108A-N, physical connections and the parameter values in the first engineering diagram is provided to the modifier module 406, the program management module 408, and the engineering diagram analytics module 410 in order to provide relevant inputs back to the engineering diagram generation module 404 for generating engineering diagram analytics model and generating second engineering diagram. Specifically, the engineering diagram generation module 404 is further configured for generating a second engineering diagram representing the upgraded portion of the technical installation 106 based on the generated engineering diagram analytics model. The upgraded portion of the technical installation 106 comprises a change in the one or more physical components 108A-N, the physical connections and the parameter values in the first engineering diagram.

The engineering diagram analytics module 410 is configured for determining the parameter values associated with the deviation in the one or more physical components 108A-N and the physical connections, upon identifying the deviation in the one or more physical components 108A-N, physical connections and the parameter values in the first engineering diagram. For example, the parameter values comprise meaning of the program, domain of the graphical program (hardware associated, memory associated, objects referenced, inputs relied upon, outputs generated), program attributes such as code size, memory consumption, style and compiler flags and parameters related to one or more physical components and the physical connections. Further, the engineering diagram analytics module 410 is configured for classifying the parameter values associated with the deviation in the one or more physical components 108A-N and the physical connections into one or more engineering category. Each of the one or more engineering category comprises a set of defined actions to be performed. The one or more engineering category comprises program variable category, domain category, component level category, configuration information category, subcomponent level category, program logic category, function block category and the like. The set of actions to be performed is stored across respective one or more engineering category as a hash table in the database 118.

Further, the engineering diagram analytics module 410 is configured for generating the engineering diagram analytics model for each of the classified engineering category. The engineering diagram analytics model defines a set of defined rules corresponding to each of the one or more engineering category. The engineering diagram analytics model may be derived using any artificial intelligence or machine learning techniques. The generated engineering diagram analytics model is provided as an input to the modifier module 406 and the program management module 408.

The modifier module 406 is configured for modifying the first engineering diagram based on the generated engineering diagram analytics model. Specifically, the modifier module 406 is configured for generating predictions for modifying the first engineering diagram based on the engineering diagram analytics model and further modifying the first engineering diagram based on the generated predictions. The predictions comprise one or more changed parameter values associated with the one or more physical components 108A-N and the physical connections. The predictions are generated as the first engineering diagram is being modified.

Further, the modifier module 406 is configured for generating recommendations for modifying the first engineering diagram based on the engineering diagram analytics model and modifying the first engineering diagram based on the generated recommendations. The recommendations indicate modifications to the first engineering diagram in order to optimize the generation of second engineering diagram as per the received requirement. These recommendations are generated as the first engineering diagram is being modified.

The program management module 408 is configured to manage the graphical programs corresponding to each of the one or more physical components 108A-N, physical connections between the one or more physical components 108A-N, and a plurality of parameter values associated with the one or more physical components 108A-N and the physical connections. A graphical program comprises a program logic. Each graphical program comprises a set of programmable instructions or statements corresponding to the program logic. Each graphical program may correspond to a function block under an engineering diagram. The engineering diagram may comprise several such function blocks. The users at the client devices 120A-N uses the engineering tool 122A-N in order to design or develop engineering diagrams by coding each of these graphical programs.

The programming language management module 412 is configured for identifying current programming language associated with the graphical programs of the first engineering diagram. The current programming language may be for example Structured text (ST) or Graphical language (LAD, FBD). Further, the programming language management module 412 is configured for determining a program logic pattern associated with the current programming language based on graphical program statements, graphical program data flow, basic graphical program data block demarcation and identifying number of jump values in the graphical program. The program logic pattern is identified by answering the following questions and connecting the answers to understand the meaning of the program. For example how, why and what individual variables are treated in the graphical program, how, why and what variables are treated in a combination in the graphical program, what are the relationships among the variables, what is the order in which the variable are treated and what are the results used for, and the like.

Furthermore, the programming language management module 412 is configured for generating a modified program logic pattern associated with a desired programming language based on the determined program logic pattern associated with the current programming language. The desired programming language may be for example Structured text (ST) or graphical language (LAD, FBD). Additionally, the programming language management module 412 is configured for transforming the current programming language associated with the graphical programs into the desired programming language based on the generated modified program logic pattern.

Additionally, the programming language management module 412 is configured for classifying a first set of graphical programs of the first engineering diagram into one or more segments based on the program logic of the first set of graphical programs. The first set of graphical programs corresponds to a first programming language. The first set of graphical programs are selected based on program logic's commonality in usage and re-occurrence in various other blocks. The first programming language may be for example, an SCL logic. Further, the programming language management module 412 is configured for determining a similar program logic associated with a second set of graphical programs stored in a database 118 based on the classified one or more segments. The second set of graphical programs corresponds to a second programming language. A search in the database 118 is conducted to retrieve similar program logics associated with a different/second set of graphical programs. The second set of graphical programs may be for example in LAD logic. In this case, the programming language management module 412 is configured for adapting the similar program logic of the second set of graphical programs into the program logic of the first set of graphical programs.

The visualization module 414 is configured for outputting the engineering diagrams, such as first engineering diagram and second engineering diagrams on a graphical user interface. The visualization module 414 is also configured for visualizing behavior of the portion or upgraded portion of the technical installation 106. The visualization module 414 is configured for displaying modifications made to the engineering diagrams, generation simulation and validation reports and displaying the simulation and validation results respectively.

The data store 416 is configured for generating a program library comprising the generated engineering diagram analytics model for each of the classified segments correspondingly mapped to one or more graphical programs. The data store 416 is configured for continuously updating the program library with updated versions of the engineering diagrams.

Figure 5:
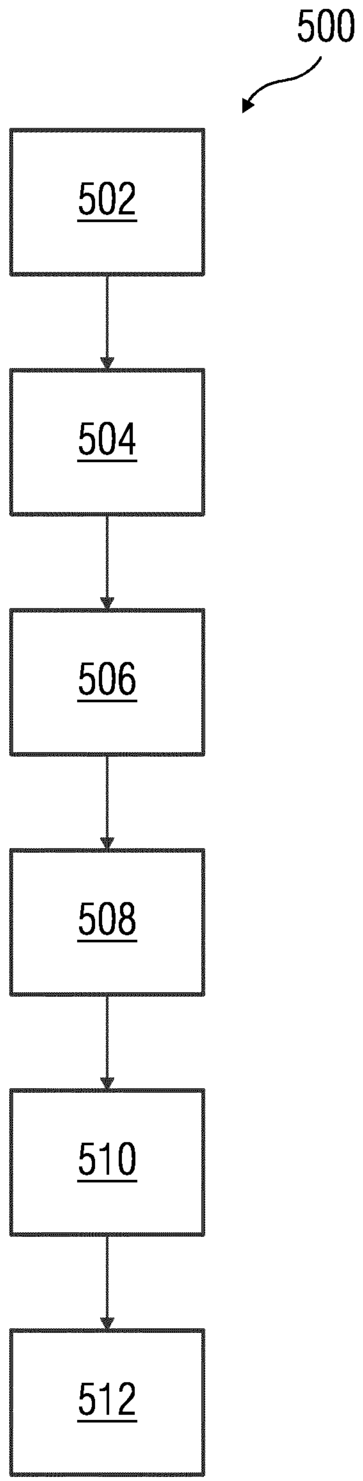
FIG. 5 is a process flowchart illustrating an exemplary method of generating engineering diagrams in an engineering system, according to an embodiment of the present disclosure.

FIG. 5 is a process flowchart illustrating an exemplary method 500 of generating engineering diagrams in the engineering system 102, according to an embodiment of the present disclosure. At step 502, the specification of the one or more physical components 108A-N are received, for example from a client device 120A-N. The specification of the one or more physical components 108A-N correspond to an upgraded portion of a technical installation 106.

At step 504, a first engineering diagram representing a portion of a technical installation 106 is obtained from a database 118. The first engineering diagram comprises a representation of one or more physical components 108A-N in the portion of the technical installation 106, physical connections between the one or more physical components 108A-N, and a plurality of parameter values associated with the one or more physical components 108A-N and the physical connections. Further, the first engineering diagram comprising a representation of one or more physical components 108A-N in the portion of the technical installation 106, physical connections between the one or more physical components 108A-N, and a plurality of parameter values associated with the one or more physical components 108A-N and the physical connections are configured in the engineering system 102 using a respective graphical program. Each graphical program comprises a program logic associated with each of the one or more physical components 108A-N, physical connections between the one or more physical components 108A-N and the plurality of parameter values.

At step 506, the deviation in the one or more physical components (108A-N), the physical connections and the parameter values in the first engineering diagram is identified based on the specification of the one or more physical components 108A-N.

At step 508, an engineering diagram analytics model for the first engineering diagram is generated based on the identified deviation in the one or more physical components 108A-N, the physical connections and the parameter values in the first engineering diagram.

At step 510, a second engineering diagram representing the upgraded portion of the technical installation 106 is generated based on the generated engineering diagram analytics model. The upgraded portion of the technical installation 106 comprises a change in the one or more physical components 108A-N, the physical connections and the parameter values in the first engineering diagram.

At step 512, the second engineering diagram representing the upgraded portion of the technical installation 106 is outputted on a graphical user interface.

Figure 6A:
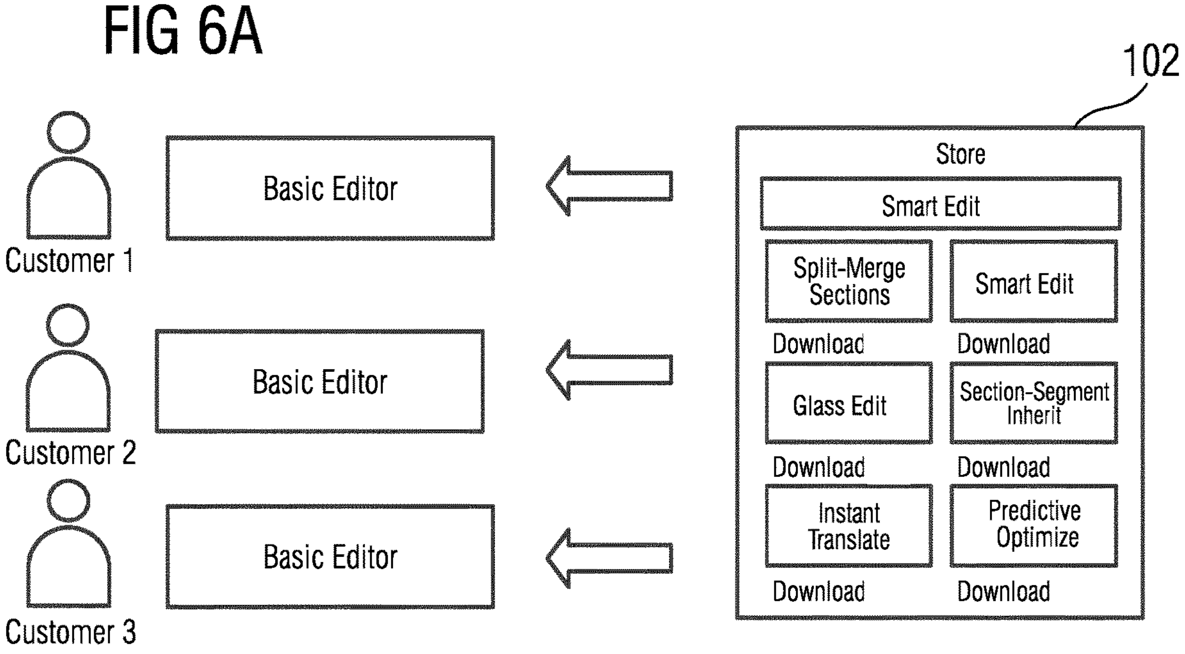
FIG. 6A is a modularized graphical program editor.
Figure 6B:
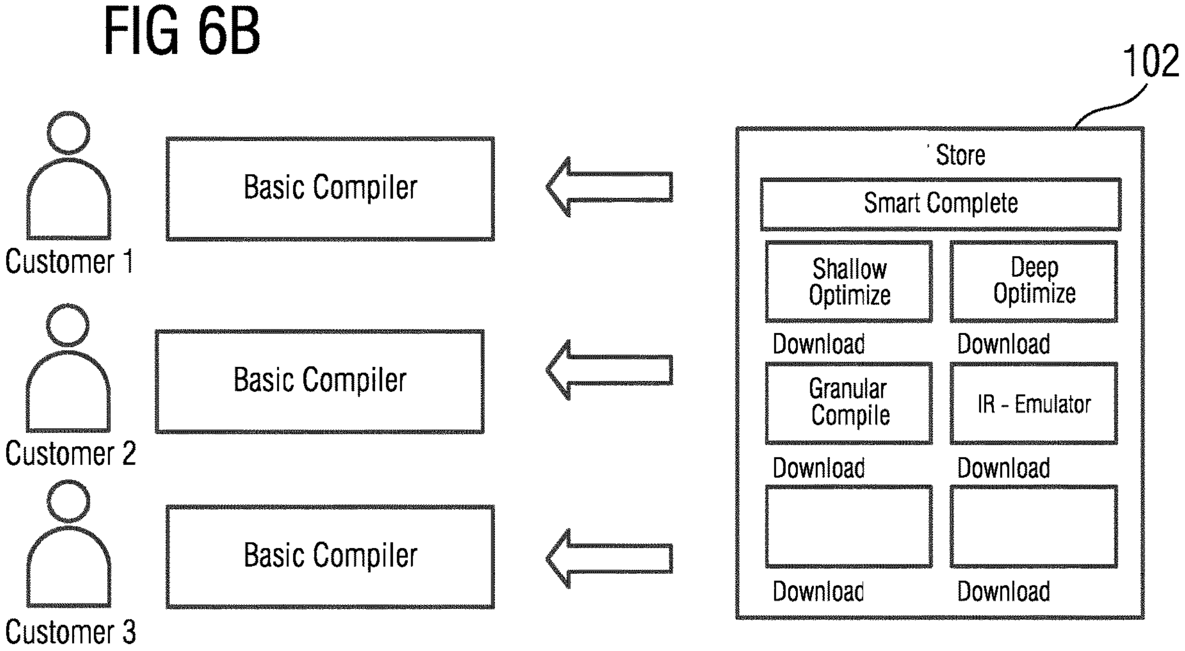
FIG. 6B is a screenshot of an exemplary graphical user interface for managing engineering diagrams, according to an embodiment of the present disclosure.

FIG. 6A-B is a screenshot of an exemplary graphical user interface for managing engineering diagrams, according to an embodiment of the present disclosure. In FIG. 6A, a modularized graphical program editor is depicted. The graphical user interface at an engineering system, such as engineering system 102 may be used by one or more users at the one or more client devices 120A-N to edit the graphical programs associated with the first engineering diagram based on the received specification. The modularized graphical program editor comprises one or more types of edit services such as split merge sections, glass edit, section segment inherits, instant translate, predictive optimize and the like. Basically, the modularized graphical program editor provides predictions to the first engineering diagram in the form of declarations. The predictions are generated based on the engineering diagram analytics model. Similarly, in FIG. 6B, a modularized graphical program compiler is depicted. The graphical user interface at an engineering system, such as engineering system 102 may be used by one or more users at the one or more client devices 120A-N to compile the graphical programs associated with the first engineering diagram. The modularized graphical program compiler comprises one or more types of compile services such as shallow optimize, deep optimize, granular compile, Intermediate Representation emulator, and the like.

Figure 7:
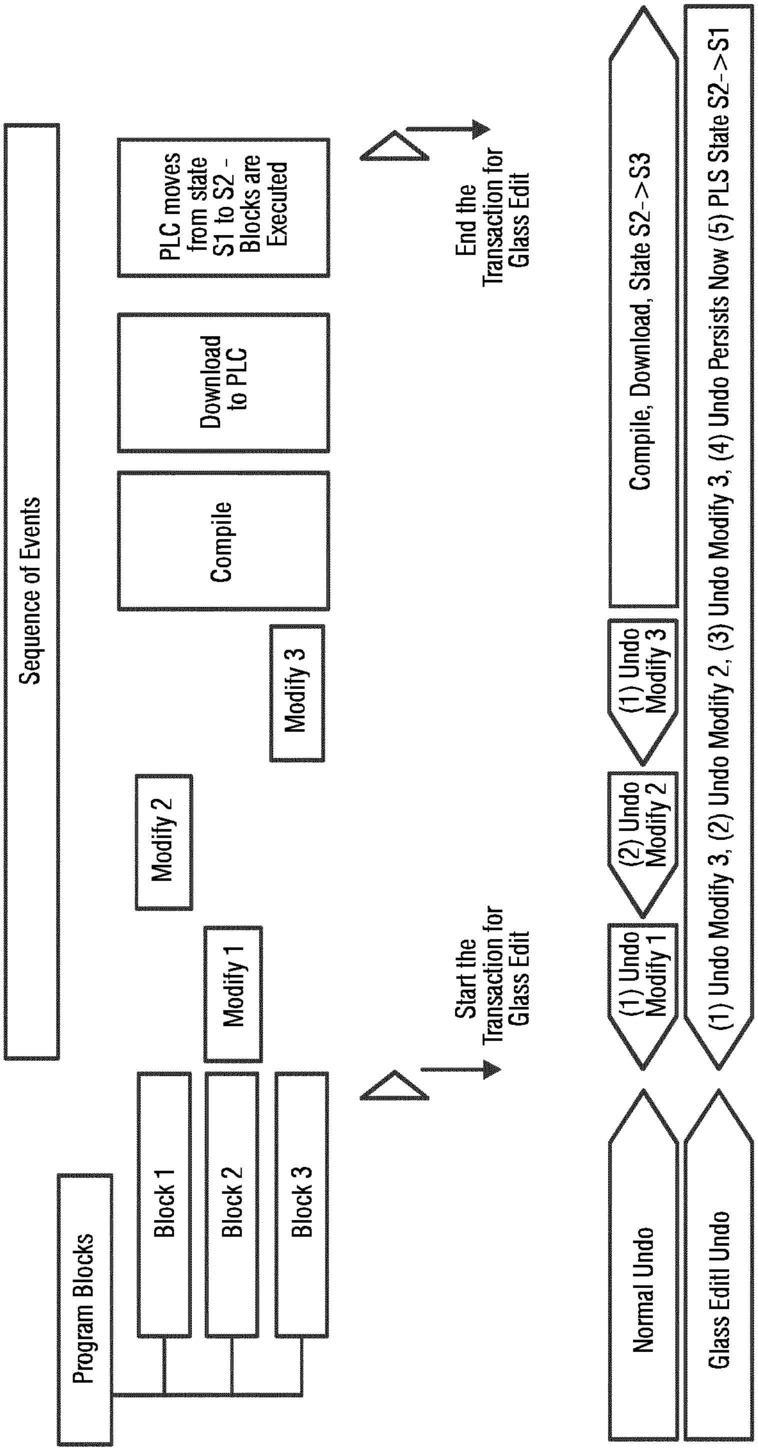
FIG. 7 is a schematic representation of an exemplary method for modifying engineering diagrams, according to an embodiment of the present disclosure.

FIG. 7 is a schematic representation of an exemplary method for modifying engineering diagrams, according to an embodiment of the present disclosure. In FIG. 7, a mechanism for modifying engineering diagrams, specifically the graphical programs are depicted. In an embodiment, the automation module 112 of the engineering system 102 allows the users of the one or more client devices 120A-N to modify first engineering diagrams, generate second engineering diagrams, simulate the second engineering diagram, compile the second engineering diagram and deploy the second engineering diagram onto the physical components 108A-N. Before deployment, the simulation results of the second engineering diagram are validated. If for example, the validation results are negative, which implies that the desired engineering diagram is not generated, then as shown in FIG. 7, the automation module 112 allows the user to perform 'undo' operation, which collectively rollbacks all the modifications made so far to the first engineering diagram. Further, a 'redo' operation reperforms all the modifications made to the first engineering diagram again.

Figure 8A:
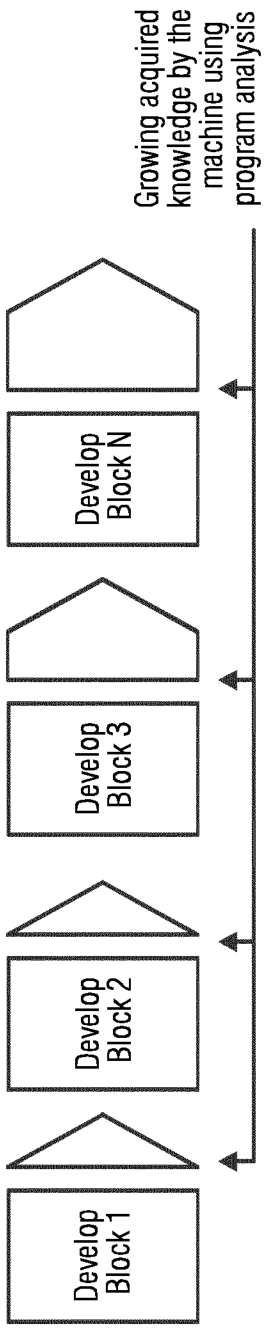
FIG. 8A depicts a mechanism for obtaining learnings of the graphical program blocks.
Figure 8B:
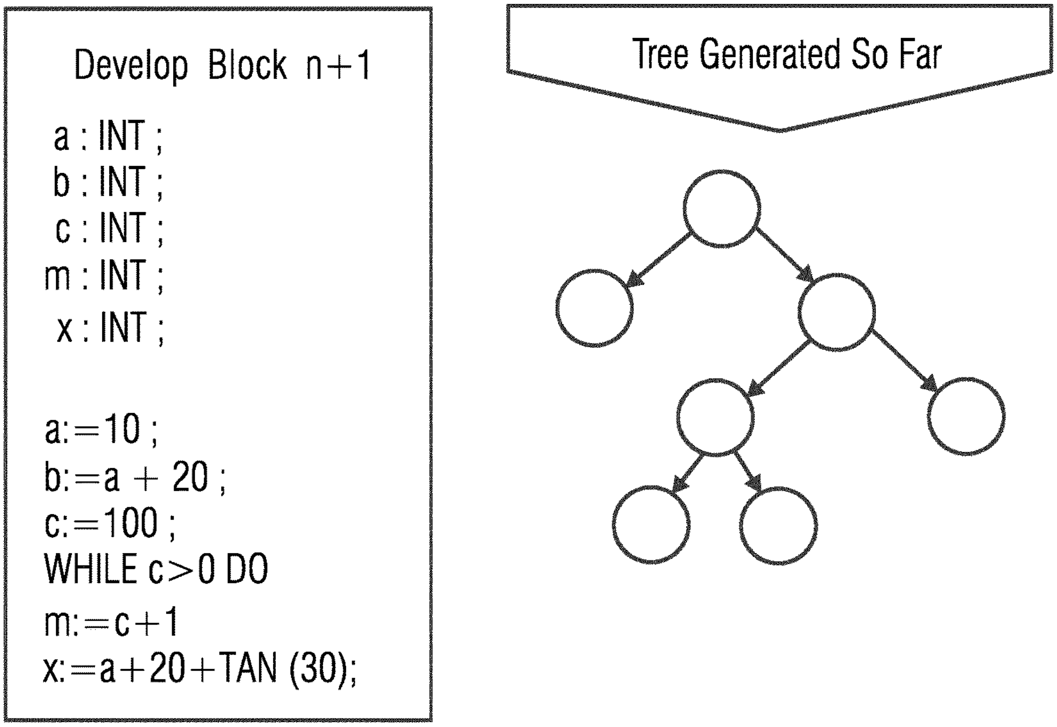
FIG. 8B is a syntax tree for each graphical program block developed.
Figure 8C:
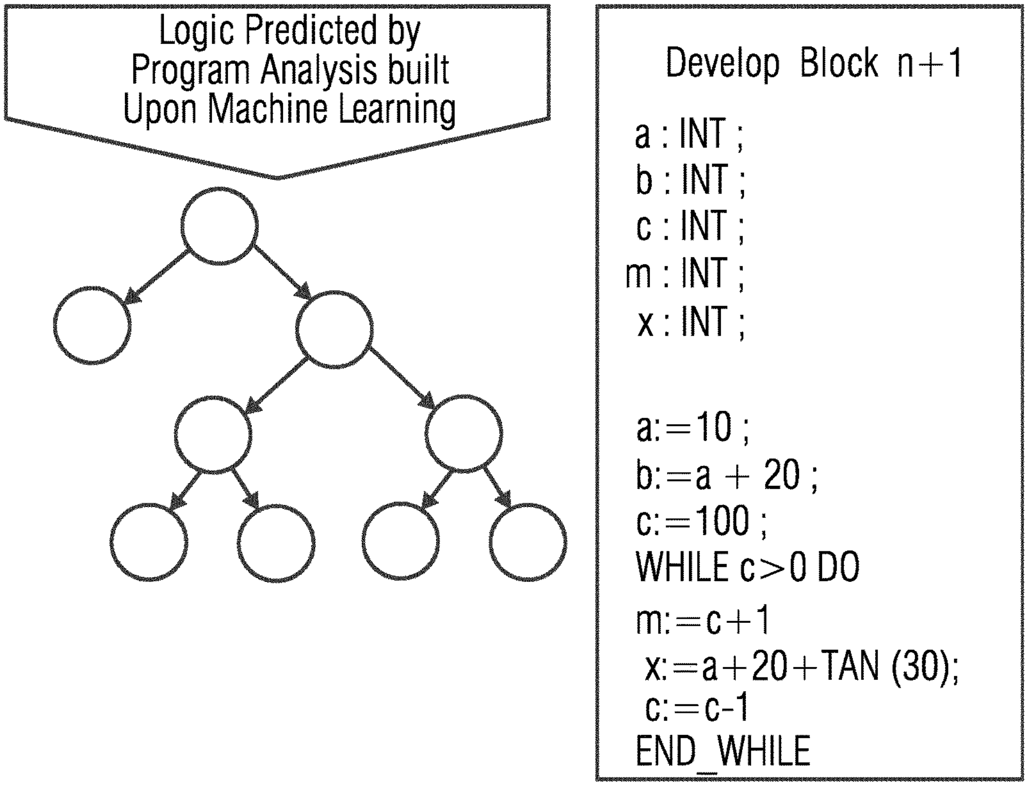
FIG. 8C depicts generated predictions on the program logic of the graphical program block.
Figure 8D:
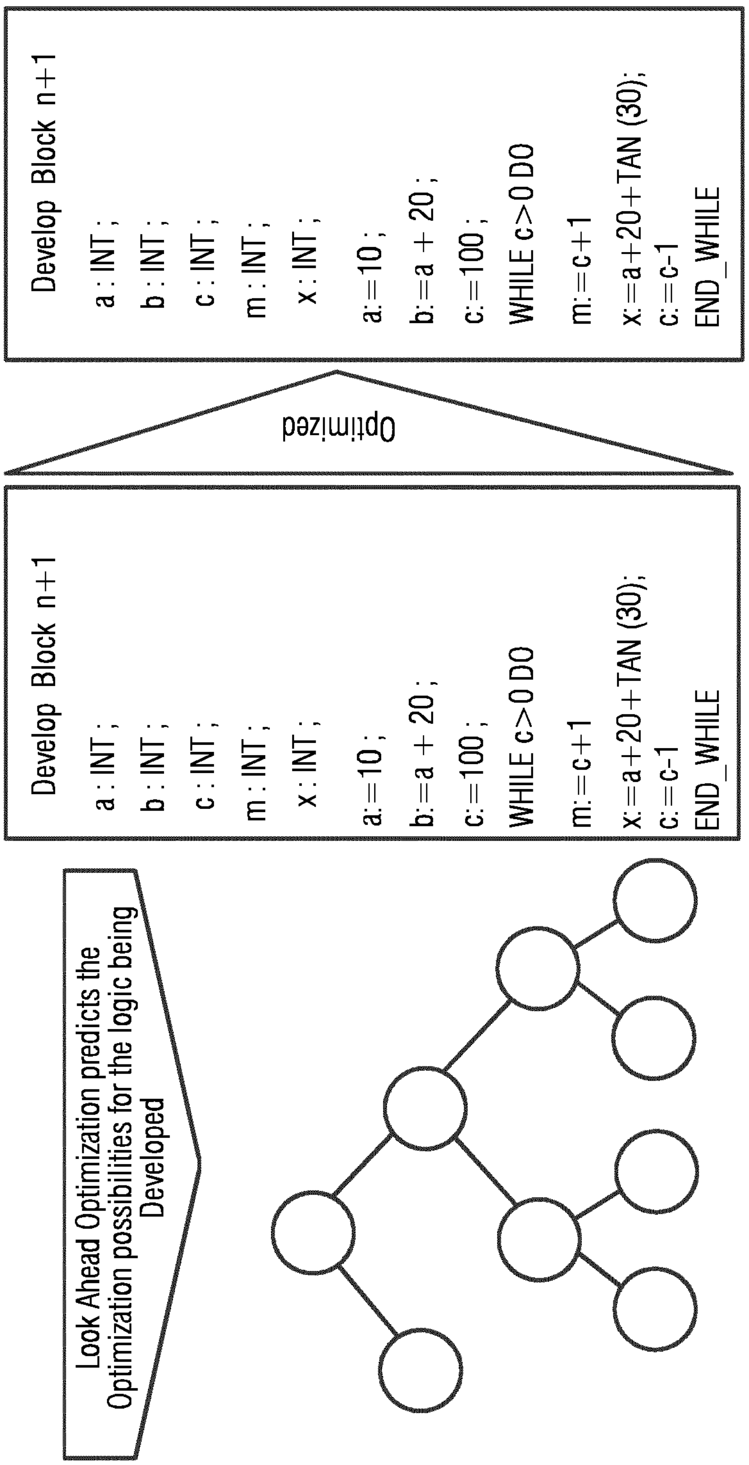
FIG. 8D is a schematic representation of an exemplary method for generating predictions and recommendations for the first engineering diagram based on the engineering diagram analytics model, according to an embodiment of the present disclosure.

FIG. 8A-8D is a schematic representation of an exemplary method for generating predictions and recommendations for the first engineering diagram based on the engineering diagram analytics model, according to an embodiment of the present disclosure. In FIG. 8A, a mechanism for obtaining learnings of the graphical program blocks are depicted. In FIG. 8B, a syntax tree for each graphical program block developed is generated. The syntax tree represents the relationship between each of the programming logic statements within the graphical program block. In FIG. 8C, generated predictions on the program logic of the graphical program block is depicted. Further, a modified graphical program block (Block n+1) based on predicted program logic is generated. In FIG. 8D, generated recommendations on the program logic of the graphical program block is depicted. Further, a modified graphical program block (Block n+1) based on recommended program logic is generated.

Figure 9:
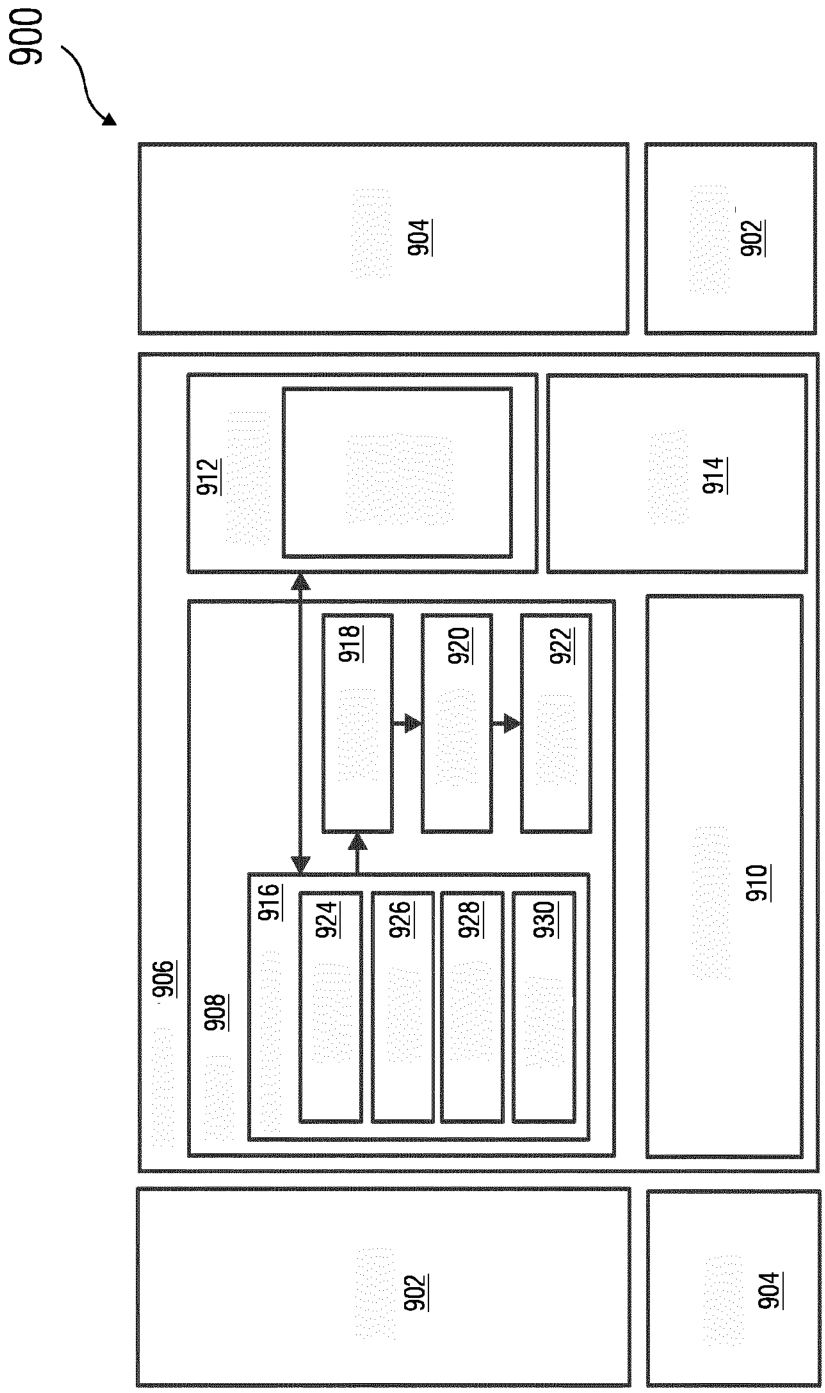
FIG. 9 is a system architecture diagram for generating engineering diagrams and translation of engineering diagrams from one programming language to another, according to an embodiment of the present disclosure.

FIG. 9 is a system architecture diagram for generating engineering diagrams and translation of engineering diagrams from one programming language to another, according to an embodiment of the present disclosure. The system 900 is similar to the engineering system 102. The system 900 comprises a ladder (LAD) logic unit 902, a structured control language (SCL) PULL unit 904, and a SCL translator 906. The SCL Translator 906 comprises a SCL target 908, SCL source 910, Common Object Model (COM) manager 912, and a persistence unit 914. The SCL target 908 comprises LAD source analyzer 916, a COM slicer 918, a SCL target identifier 920, and SCL target builder 922. Further, the LAD source analyzer 916 comprises statement identification module 924, jump identification module 926, a basic block demarcation module 928, and a data flow analysis module 930. The system 900 is configured for transforming the current programming language associated with the graphical programs into a desired programming language based on the generated modified program logic pattern. FIG. 9 is a translator 906 which translates a graphical programming language to a textual language and vice versa. The translator 906 disassembles the given graphical or textual language into statements, jumps, basic blocks and analyzes the data flow. Then the translator translates the information gained into a common object model and saves the information using the persistence layer via persistence unit 914. The persisted common object model can be translated to any target language using the target builder module 922 which uses the understanding of the target language's syntax and semantics to build the program logic.

Figure 10A:
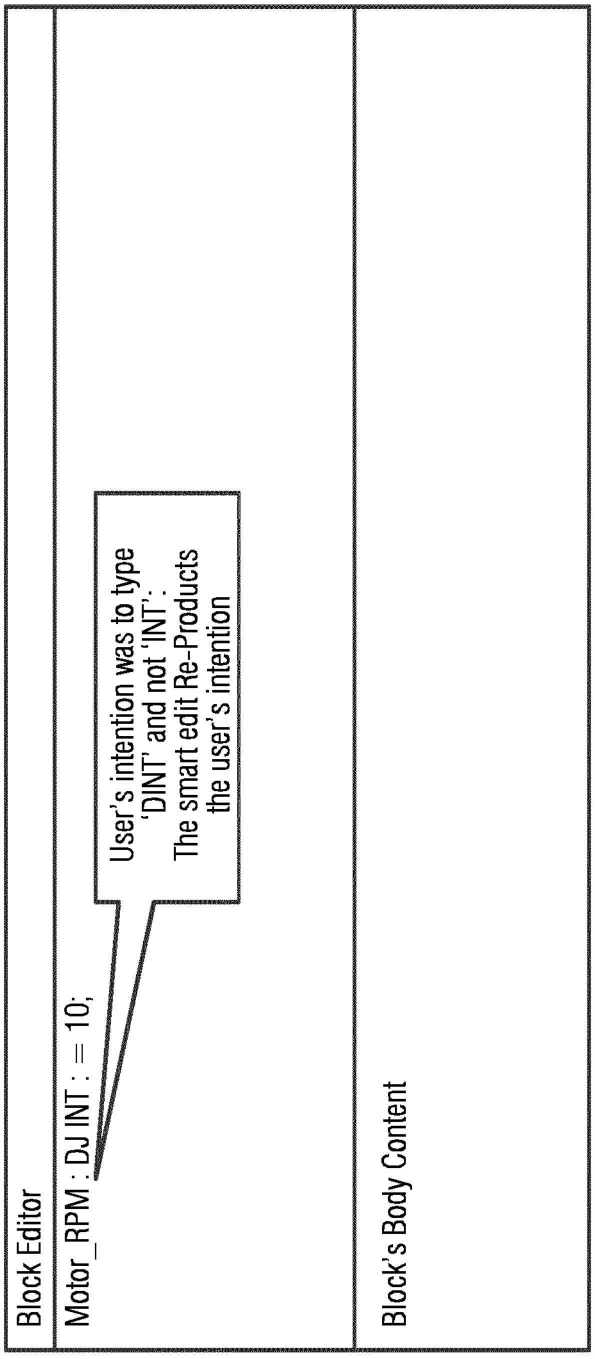
FIG. 10A depicts predictions generated while the graphical program is being developed using the graphical user interface.
Figure 10B:
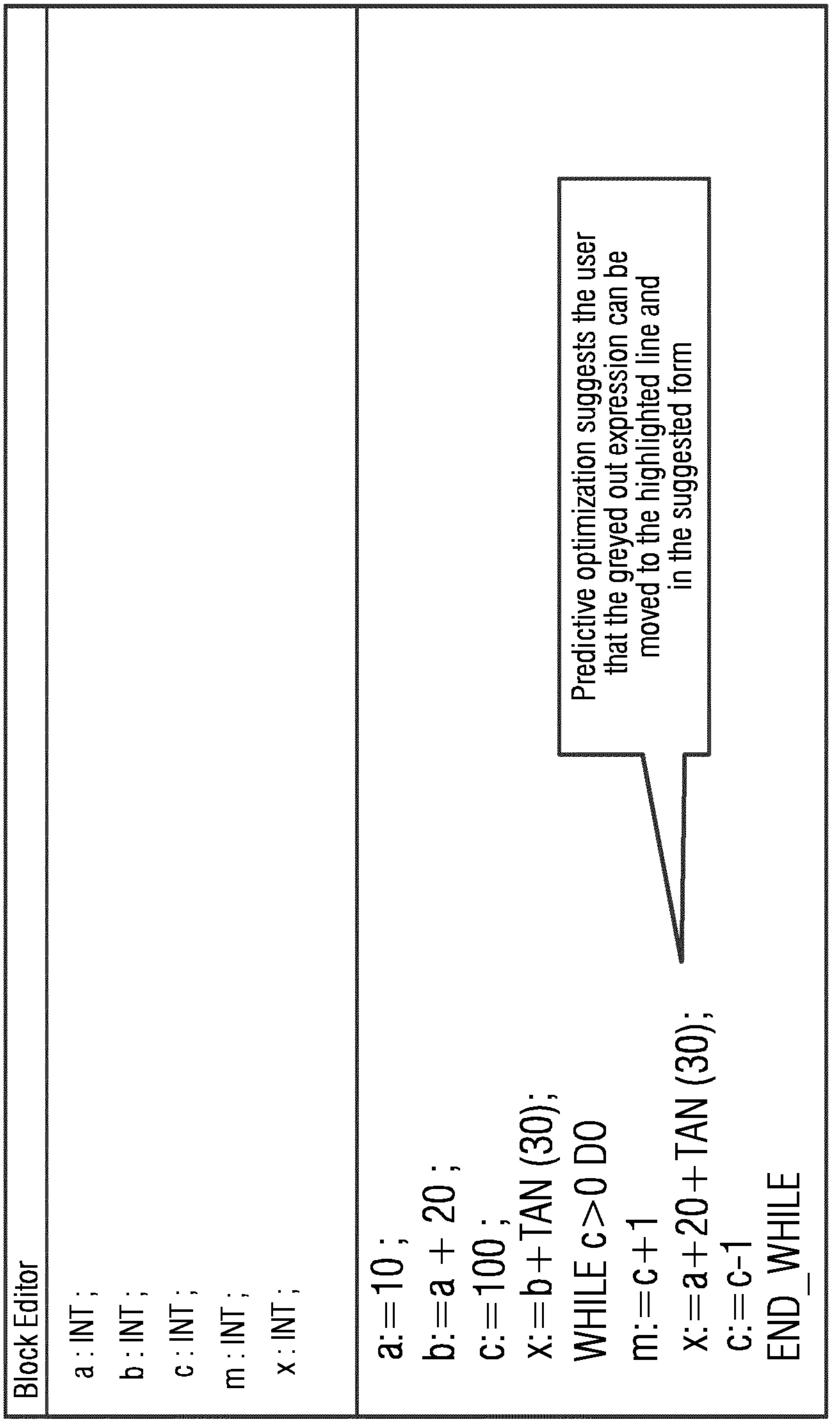
FIG. 10B depicts recommendations generated while the graphical program is being developed using the graphical user interface.
Figure 10C:
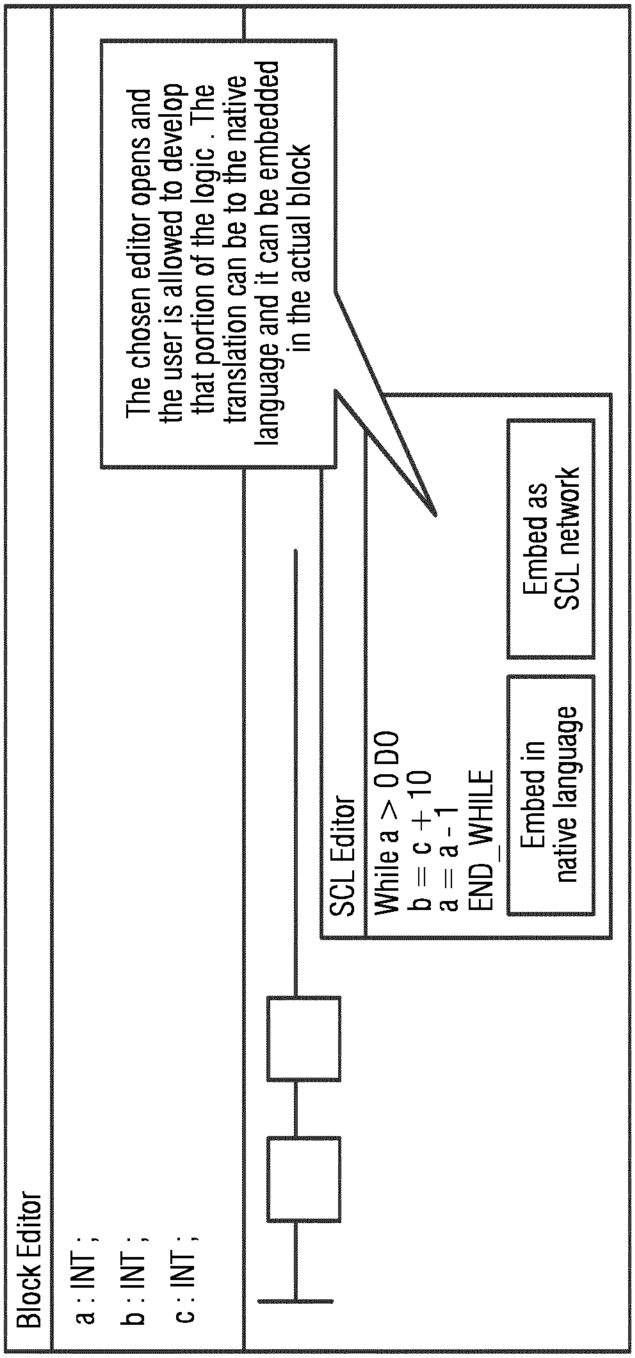
FIG. 10C depicts the programming language transformations associated with the graphical programs.
Figure 10D:
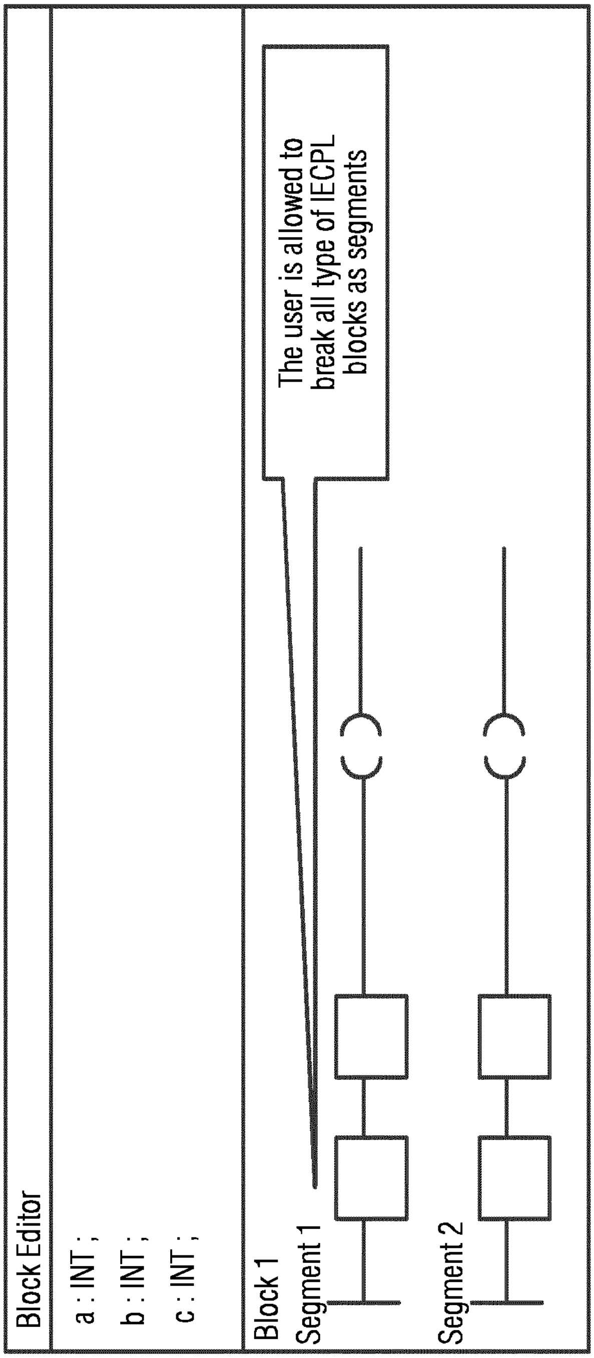
FIG. 10D depicts classifying first set of graphical programs of the first engineering diagram into one or more segments and program logic inheritance across different graphical program blocks.
Figure 10E:
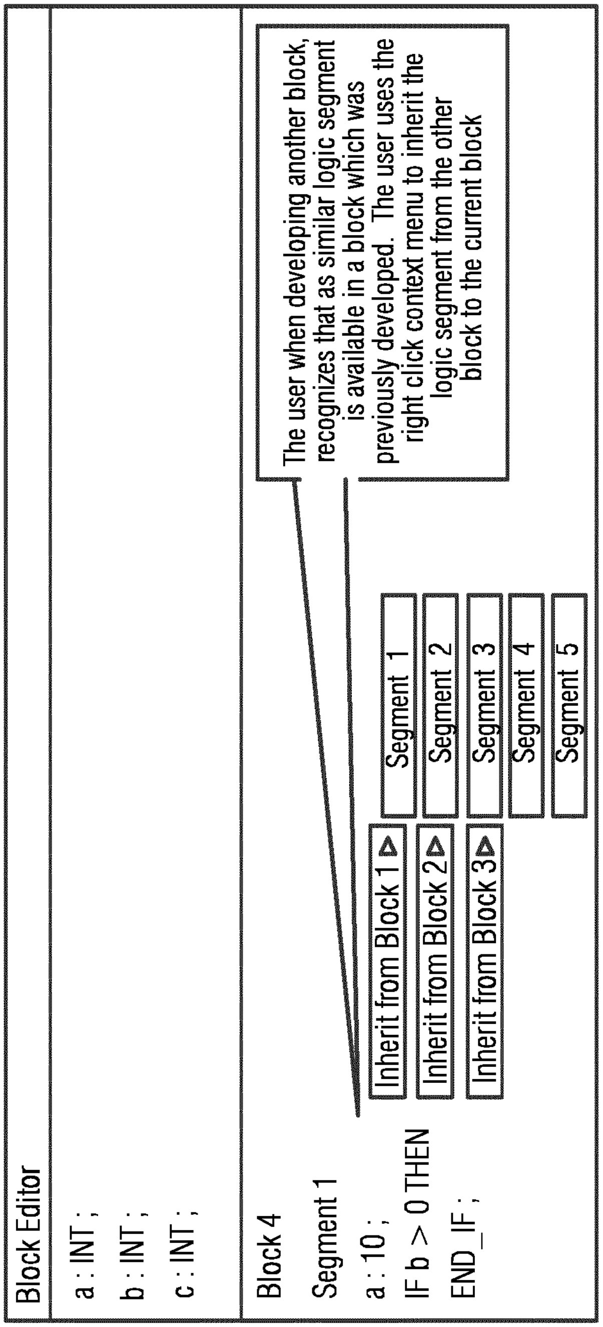
FIG. 10E is a screenshot depicting an exemplary graphical user interface for modifying engineering diagrams, according to an embodiment of the present disclosure.

FIG. 10A-10E are screenshots depicting an exemplary graphical user interface for modifying engineering diagrams, according to an embodiment of the present disclosure. The users at the client device 120A-N are provided with the graphical user interface as shown in order to develop provide inputs while generating engineering diagrams. For example, when a user starts inputting the graphical program for an engineering diagram, the engineering system 102 generates predictions and recommendations to the graphical programs and such predictions and recommendations are provided to the users via the graphical user interface. FIG. 10A depicts predictions generated while the graphical program is being developed using the graphical user interface. FIG. 10B depicts recommendations generated while the graphical program is being developed using the graphical user interface. FIG. 10C depicts the programming language transformations associated with the graphical programs. FIG. 10D and FIG. 10E depicts classifying first set of graphical programs of the first engineering diagram into one or more segments and program logic inheritance across different graphical program blocks.

The present disclosure can take a form of a computer program product comprising program modules accessible from computer-usable or computer-readable medium storing program code for use by or in connection with one or more computers, processors, or instruction execution system. For the purpose of this description, a computer-usable or computer-readable medium can be any apparatus that can contain, store, communicate, propagate, or transport the program for use by or in connection with the instruction execution system, apparatus, or device. The medium can be electronic, magnetic, optical, electromagnetic, infrared, or semiconductor system (or apparatus or device) or a propagation mediums in and of themselves as signal carriers are not included in the definition of physical computer-readable medium include a semiconductor or solid state memory, magnetic tape, a removable computer diskette, random access memory (RAM), a read only memory (ROM), a rigid magnetic disk and optical disk such as compact disk read-only memory (CD-ROM), compact disk read/write, and DVD. Both processors and program code for implementing each aspect of the technology can be centralized or distributed (or a combination thereof) as known to those skilled in the art.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for generating engineering diagrams in an engineering system, comprising:

receiving, by a processor, specification of one or more physical components, wherein the specification of the one or more physical components correspond to an upgraded portion of a technical installation;

obtaining, by the processor, a first engineering diagram representing a portion of the technical installation, wherein the first engineering diagram comprises a representation of the one or more physical components in the portion of the technical installation, physical connections between the one or more physical components, and a plurality of parameter values associated with the one or more physical components and the physical connections;

identifying a deviation in the one or more physical components, the physical connections and the parameter values in the first engineering diagram based on the specification of the one or more physical components;

generating an engineering diagram analytics model for the first engineering diagram based on the identified deviation in the one or more physical components, the physical connections and the parameter values in the first engineering diagram, wherein the engineering diagram analytics model is generated based on learnings from previously generated engineering diagrams, the learnings obtained using machine learning or artificial intelligence;

modifying the first engineering diagram based on the generated engineering diagram analytics model by generating predictions for modifying the first engineering diagram, wherein the predictions comprise one or more changed parameter values associated with the one or more physical components and the physical connections, and modifying the first engineering diagram based on the generated predictions;

generating a second engineering diagram representing the upgraded portion of the technical installation based on the generated engineering diagram analytics model, wherein the upgraded portion of the technical installation comprises a change in the one or more physical components, the physical connections and the parameter values in the first engineering diagram;

outputting the second engineering diagram representing the upgraded portion of the technical installation on a graphical user interface;

generating a simulation instance for the second engineering diagram representing the upgraded portion of the technical installation;

simulating behavior of the upgraded portion of the technical installation in a simulation environment by executing the second engineering diagram on the generated simulation instance;

validating the behavior of the upgraded portion of the technical installation based on results of simulation; and deploying the second engineering diagram in real-time into the upgraded portion of the technical installation based on the validation.

2. The method according to claim 1, wherein identifying the deviation in the one or more physical components, the physical connections and the parameter values in the first engineering diagram based on the specification related to the one or more physical components comprises:

parsing the specification of the one or more physical components indicating the upgraded portion of the technical installation;

extracting the information related to the one or more physical components, the physical connections between the one or more physical components, and the plurality of parameter values associated with the one or more physical components and the physical connections;

comparing the first engineering diagram representing the portion of the technical installation with the extracted information; and identifying the deviation in the one or more physical components, the physical connections and the parameter values in the first engineering diagram based on the comparison.

3. The method according to claim 1, wherein generating the engineering diagram analytics model for the first engineering diagram based on the identified deviation in the one or more physical components, the physical connections and the parameter values in the first engineering diagram comprises:

determining the parameter values associated with the deviation in the one or more physical components and the physical connections;

classifying the parameter values associated with the deviation in the one or more physical components and the physical connections into one or more engineering category, wherein each of the one or more engineering category comprises a set of defined actions to be performed; and generating the engineering diagram analytics model for each of the classified engineering category, wherein the engineering diagram analytics model defines a set of rules corresponding to each of the one or more engineering category.

4. The method according to claim 3, wherein modifying the first engineering diagram based on the generated engineering diagram analytics model comprises:

generating recommendations for modifying first engineering diagram based on the engineering diagram analytics model, wherein the recommendations indicate modifications to the first engineering diagram; and modifying the first engineering diagram based on the generated recommendations.

5. The method according to claim 3, wherein modifying the first engineering diagram based on the generated engineering diagram analytics model comprises:

classifying a first set of graphical programs of the first engineering diagram into one or more segments based on the program logic of the first set of graphical programs, wherein the first set of graphical programs corresponds to a first programming language;

determining a similar program logic associated with a second set of graphical programs stored in a database based on the classified one or more segments, wherein the second set of graphical programs corresponds to a second programming language; and adapting the similar program logic of the second set of graphical programs into the program logic of the first set of graphical programs.

6. The method according to claim 1, wherein the first engineering diagram comprising the representation of the one or more physical components in the portion of the technical installation, the physical connections between the one or more physical components, and the plurality of parameter values associated with the one or more physical components and the physical connections are configured using a respective graphical program and wherein each graphical program comprises a program logic associated with each of the one or more physical components, the physical connections between the one or more physical components and the plurality of parameter values.

7. The method according to claim 6, further comprising:

identifying current programming language associated with the graphical programs of the first engineering diagram;

determining a program logic pattern associated with the current programming language based on graphical program statements, graphical program data flow, basic graphical program data block demarcation and identifying number of jump values in the graphical program;

generating a modified program logic pattern associated with a desired programming language based on the determined program logic pattern associated with the current programming language; and transforming the current programming language associated with the graphical programs into a desired programming language based on the generated modified program logic pattern.

8. An engineering system for generating engineering diagrams in an industrial environment, wherein the engineering system comprises:

one or more processor(s); and a memory coupled to the one or more processor(s), wherein the memory comprises an automation module stored in the form of machine-readable instructions executable by the one or more processor(s), wherein the automation module is capable of performing the method according to claim 1.

9. An industrial environment comprising:

the engineering system as claimed in claim 8;

a technical installation comprising one or more physical components; and one or more client devices communicatively coupled to the engineering system via a network.

10. A computer-program product, comprising a computer readable hardware storage device having computer readable program code stored therein, said program code executable by a processor of a computer system to implement a method having machine-readable instructions stored therein, that when executed by a processor(s), cause the processor(s) to perform the method steps according to claim 1.

11. The method according to claim 1, wherein the predictions are generated as program statements aiding users to generate the second engineering diagram.

12. The method according to claim 1, wherein the learnings are stored in a trained program table.

13. The method according to claim 1, wherein generating the predictions comprises generating a syntax tree for graphical program blocks of the first engineering diagram.

14. The method according to claim 1, wherein the predictions are generated as the first engineering diagram is being modified.

* * * * *